United States Patent
Roy et al.

(10) Patent No.: US 9,622,350 B2
(45) Date of Patent: Apr. 11, 2017

(54) METHOD OF FORMING A CIRCUIT BOARD

(71) Applicants: Mihir K. Roy, Chandler, AZ (US); Mathew J. Manusharow, Phoenix, AZ (US)

(72) Inventors: Mihir K. Roy, Chandler, AZ (US); Mathew J. Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 682 days.

(21) Appl. No.: 14/040,637

(22) Filed: Sep. 28, 2013

(65) Prior Publication Data

US 2015/0092378 A1    Apr. 2, 2015

(51) Int. Cl.
| | |
|---|---|
| *H05K 1/14* | (2006.01) |
| *H05K 3/20* | (2006.01) |
| *H05K 3/00* | (2006.01) |
| *H05K 3/10* | (2006.01) |
| *H05K 3/18* | (2006.01) |

(52) U.S. Cl.
CPC ........... *H05K 1/141* (2013.01); *H05K 3/0026* (2013.01); *H05K 3/107* (2013.01); *H05K 3/182* (2013.01); *H05K 3/207* (2013.01); *H05K 2201/10378* (2013.01); *H05K 2201/10734* (2013.01); *Y10T 29/49128* (2015.01)

(58) Field of Classification Search
CPC ...... H05K 1/111; H05K 3/0026; H05K 3/107; H05K 3/182; H05K 1/141; H05K 3/207; H05K 2201/10378; H05K 2201/10734
See application file for complete search history.

(56) References Cited

U.S. PATENT DOCUMENTS 6,300,158 B1 * 10/2001 Simburger .......... H01L 31/0445
                                                          438/59
2011/0304041 A1 * 12/2011 Chung ................ H01L 23/5387
                                                          257/737

* cited by examiner

*Primary Examiner* — Carl Arbes
(74) *Attorney, Agent, or Firm* — Blakely, Sokoloff, Taylor & Zafman LLP

(57) ABSTRACT

A circuit board upon which to mount an integrated circuit chip may include a first interconnect zone on the surface of the circuit board having first contacts with a first pitch, and a second interconnect zone, surrounding the first zone, having second contacts or traces with a second pitch that is smaller than the first pitch. The first contacts may have a design rule (DR) for direct chip attachment (DCA) to an integrated circuit chip. The first contacts may be formed by bonding a sacrificial substrate having the first contacts to a surface of the board; or by laser scribing trenches where the conductor will be plated to create the first contacts. Such a board allows DCA of smaller footprint processor chips for devices, such as tablet computers, cell phones, smart phones, and value phone devices.

12 Claims, 7 Drawing Sheets

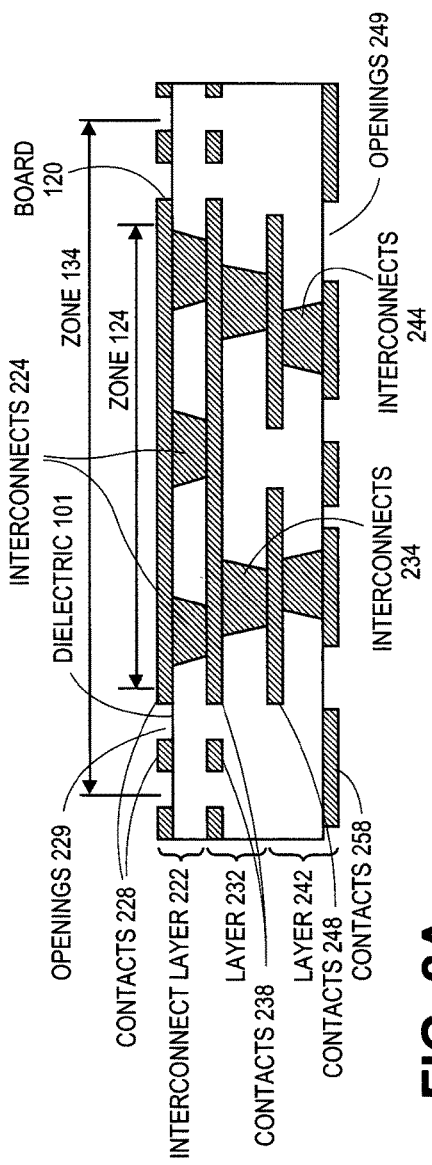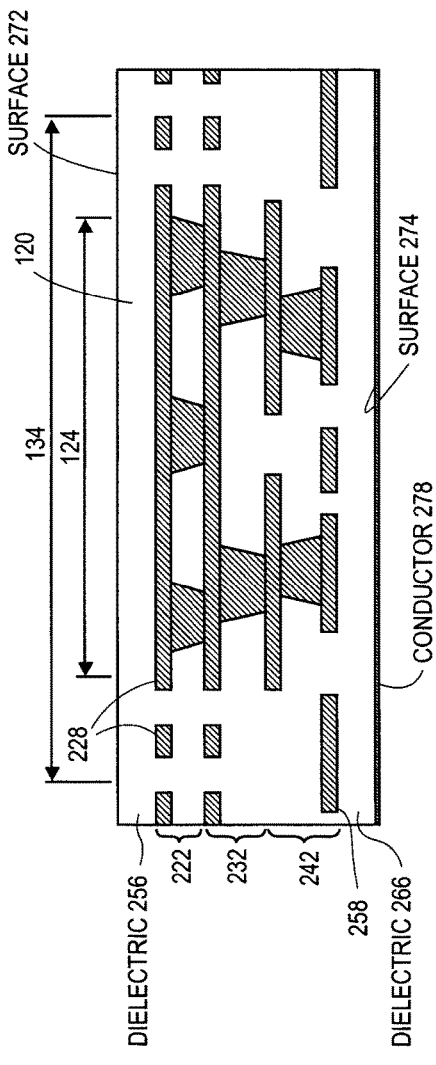
FIG. 2A
FIG. 2B

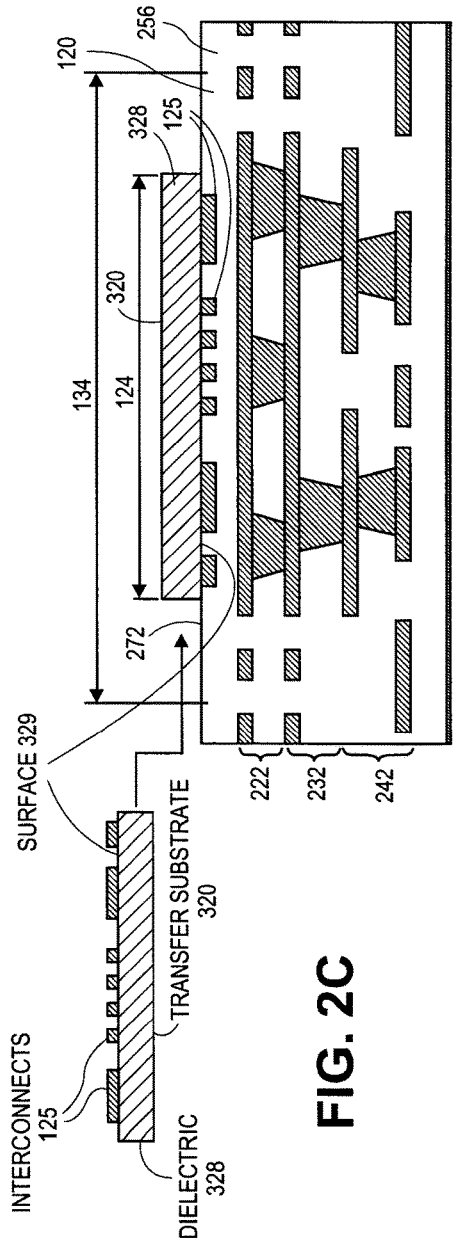
FIG. 2C
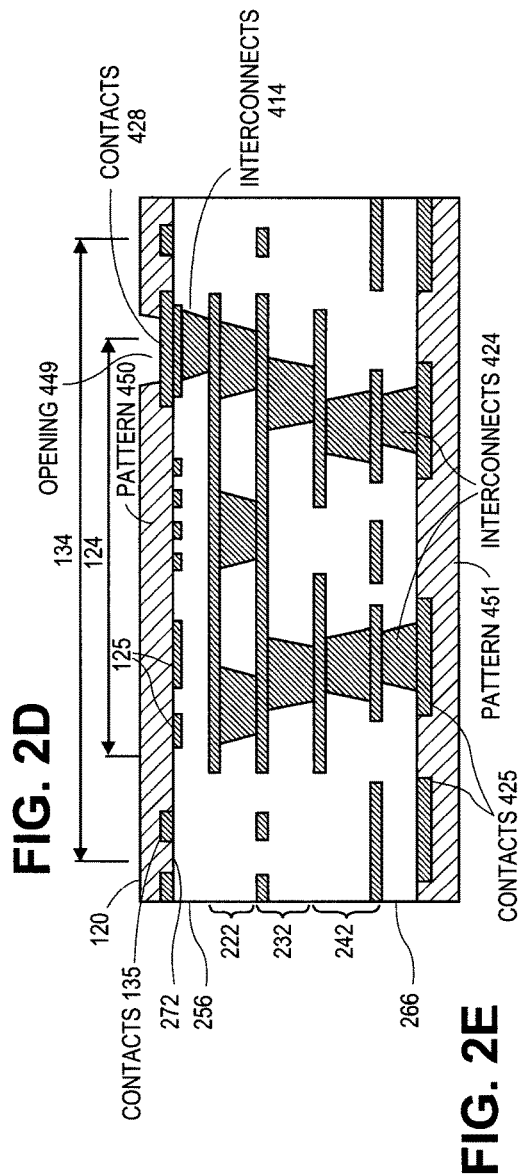
FIG. 2D
FIG. 2E

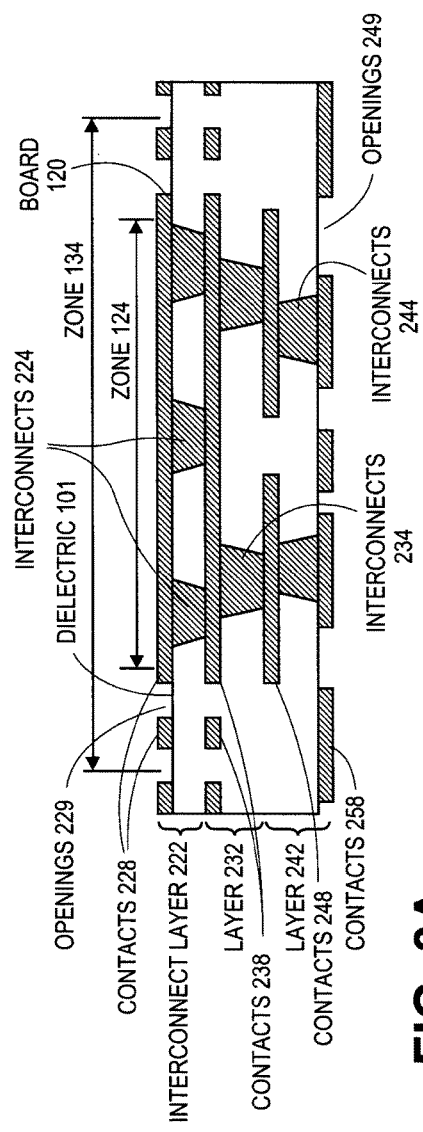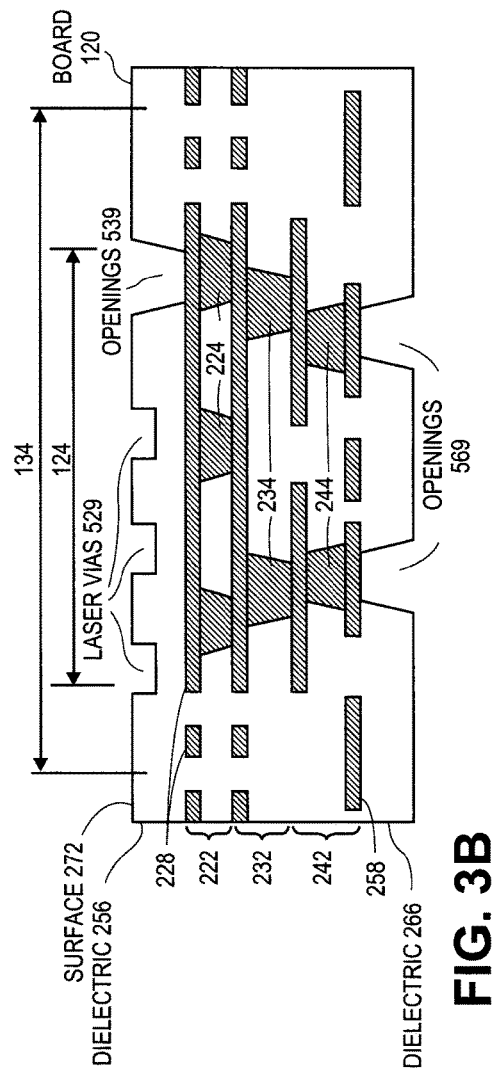
FIG. 3A
FIG. 3B

METHOD OF FORMING A CIRCUIT BOARD

FIELD

Embodiments of the invention are related generally to integrated circuit (IC) chip attachment to electronic device circuit boards, such as a motherboard. Other embodiments are also described.

BACKGROUND

Integrated circuit (IC) chips (e.g., "chips", "dies", "ICs" or "IC chips"), such as microprocessors, coprocessors, and other microelectronic devices often use package devices ("packages") to physically and/or electronically attach the IC chip to a circuit board, such as a motherboard (or motherboard interface). The die is typically mounted within a package that, among other functions, enables electrical connections between the die and a socket, a motherboard, or another next-level component. As die sizes shrink and interconnect densities increase, such electrical connections require scaling so as to match both the smaller pitches typically found at the die and the larger pitches typically found at the next-level component.

An existing approach to interconnect scaling within microelectronic packages is to use a single high density interconnect (HDI) substrate to handle the space transformation from die bump pitch, where a typical pitch value may be 130-150 micrometers (microns or µm) to system board level (e.g., motherboard) pitch, where a typical pitch value may be 400 micrometers, i.e., 0.4 millimeter (mm). This approach results in very fine line, space, and via design rules to enable die routing and very large substrate body sizes in order to interface at the system board level pitch.

For certain devices, such as tablet computers, cell phones, smart phones, and value phone devices, it may be desirable to use a smaller die or IC chip footprints. For those devices it may also be desirable to use a low height IC chip packaging, such as a "low Z-height package". However, current IC chip packages and motherboard mounting technologies suffer drawbacks, such as increased Z-height, increased cost, reduced manufacturing rate, and specialized equipment requirements, as compared to improved processes and devices described herein.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIG. 2A shows a cross-sectional side view schematic of a circuit board having interconnect layers.

FIG. 2B shows a cross-sectional side view schematic of the circuit board of FIG. 2A after forming a dielectric layer over; and dielectric and a conductive layer under the interconnect layers.

FIG. 2C shows a cross-sectional side view schematic of a transfer substrate for transferring to a surface of the circuit board of FIG. 2B.

FIG. 2D shows a cross-sectional side view schematic of the circuit board of FIG. 2B after transferring the patter of contacts from the substrate of FIG. 2C to a surface of the circuit board of FIG. 2B.

FIG. 2E shows a cross-sectional side view schematic of the circuit board of FIG. 2D after removing the transfer or sacrificial substrate to form contacts in the first interconnect zone having a pitch smaller than contacts on the rest of the circuit card.

FIG. 3A shows a cross-sectional side view schematic of a circuit board having interconnect layers. FIG. 3A may be equal to FIG. 2A.

FIG. 3B shows a cross-sectional side view schematic of the circuit board of FIG. 3A after forming a dielectric layer over interconnect layers, forming a dielectric layer under the interconnect layers, and laser drilling vias in at least the top dielectric layer.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Embodiments described herein enable direct chip attach (DCA) of an integrated circuit chip to a circuit board, such as a motherboard, without using a packaging substrate or interposer (e.g., without using a package or packaging). According to some embodiments, the motherboard interconnect pitch is only changed in scale to a smaller pitch for a zone where the chip is mounted; and the chip interconnect pitch does not have to change. In some cases, the smaller pitch zone integrates aggressive design rule (DR) (e.g., DR comparable to that of where a substrate package interconnects to a chip) and then the interconnect pitch transitions to DR comparable to that of the motherboard (e.g., DR for where a motherboard interconnects to a package substrate). The embodiments can be adopted for smartphones, value phones or, tablet segments of products.

In some cases, the zone where the chip is mounted is formed by (i) transfer of finer or smaller pitch break-out patterns of interconnects for interconnect layers in this zone (e.g., onto a pre-preg based core) than for the surrounding zone or for the rest of the circuit board. In some other cases, the zone where the chip is mounted is formed by (ii) a laser scribing process such as laser projection and patterning (LPP) of ablated traces that are filled with copper before copper etching, and after copper etching. Embodiments can be adopted for smartphones, value phones or, tablet segments of products.

Figure 1A:
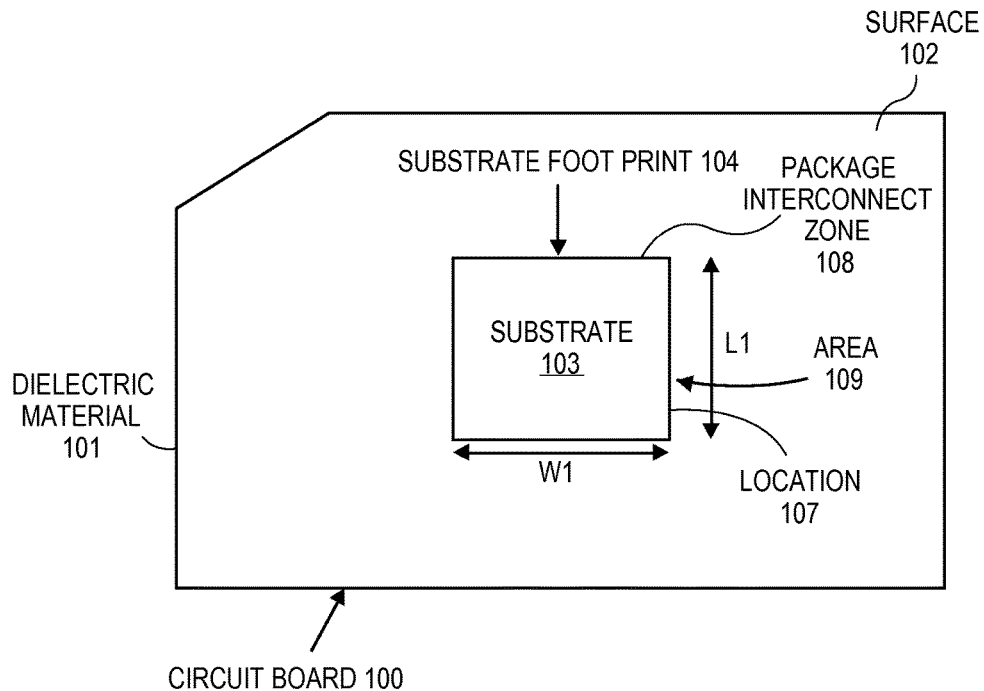
FIG. 1A is a schematic top view of a circuit board upon which a substrate package for an integrated circuit chip is mounted, according to embodiments described herein.

FIG. 1A is a schematic top view of a circuit board upon which a substrate package for an integrated circuit chip is mounted, according to embodiments described herein. FIG. 1A shows circuit board 100 including dielectric material 101 having top surface 102. Substrate 103 is mounted on surface 102 at area 109. Substrate 103 has substrate foot print 104 on or in motherboard 100. Substrate 103 has substrate footprint 104 including interconnect package zone 108 at location 107 on surface 102. Zone 108 has area 109, length L1 and width W1 on or at surface 102. Area 109 may be an area equal to L1×W1.

Substrate 103, may be a substrate upon which an IC chip may be or is mounted. Substrate 103 may be a microelectronic package including or having a microelectronic die or IC chip mounted within the package, such as on one or more substrates of substrate 103. Substrate 103 may have a height that is greater than a height of the IC chip. Footprint 104 includes package interconnect zone 108 of interconnects, such as a geographic area on surface 102 having a plurality of interconnects to which substrate 103 is attached. In some case, substrate 103 has package contacts electronically attached to package interconnects within zone 108.

According to embodiments, instead of using substrate 103, an IC chip may be directly mounted onto a circuit board. Such mounting may decrease Z-height, decrease cost, increase manufacturing rate and specialized equipment requirements. For example, direct chip attach (DCA) of an IC chip to a circuit board is an attractive proposition for reduction of bill-of-materials (BOM) cost for the tablet, smartphone, or value phone segments. However to enable this DCA the footprint, the interconnection pattern and the geometrical dimensions of the silicon and motherboard may not be compatible with each other.

Figure 1B:
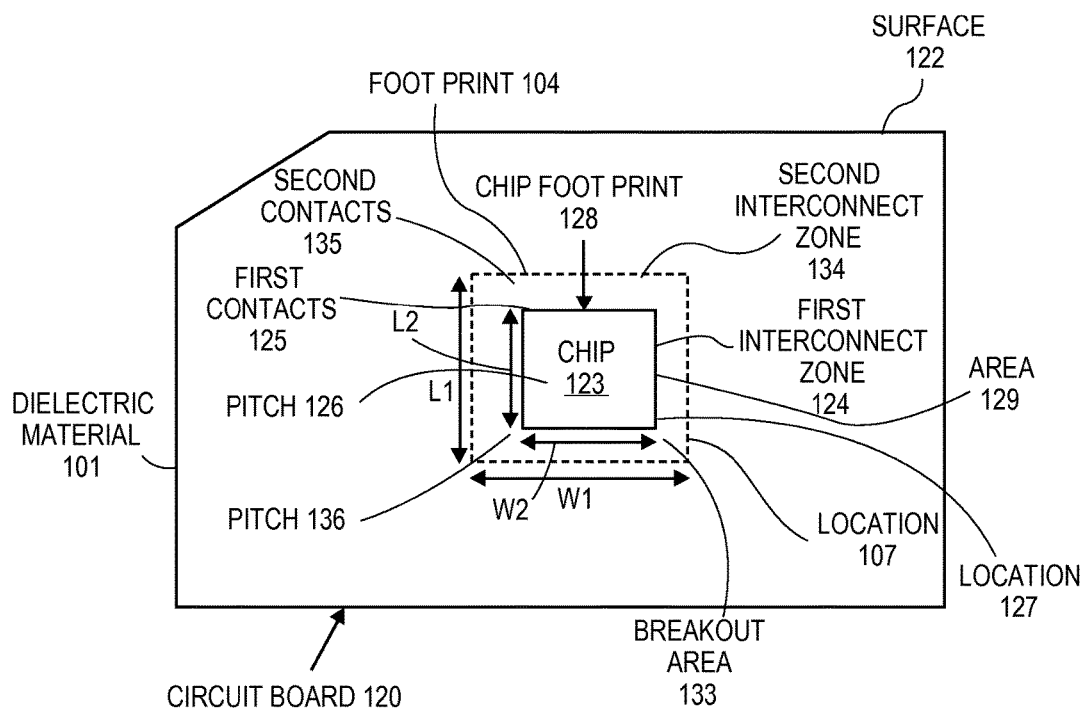
FIG. 1B is a schematic top view of a circuit board upon which an integrated circuit chip may be directly mounted, according to embodiments described herein.

FIG. 1B is a schematic top view of a circuit board upon which an integrated circuit chip may be directly mounted, according to embodiments described herein. FIG. 1B shows circuit board 120 including dielectric material 101 having top surface 122. Board 120 may be a circuit board upon which to mount an integrated circuit chip. In some cases, board 120 is a board upon which chip 123 is DCA mounted. In some cases, board 120 is a single high density interconnect (HDI) substrate.

To enable DCA of chip 123, a breakout area may be needed to make the silicon first level interconnect (FLI) design rule (DR) compatible with that of motherboard. A typical chip (e.g., tablet silicon) may be of order of 10 mm×10 mm (100 mm2) in footprint and the substrate package will be of order of 15 mm×15 mm to 17 mm×17 mm in footprint. The chip may have a first level interconnect of 130-150 micron pitch and the breakout area may have a second level interconnect of 400 micron pitch. So, to enable DCA one option for the board to scale aggressively in design rule (DR) capability, increasing the cost of the mother board many times higher. The other option could be increasing silicon size to match it to substrate foot print, definitely not a financially attractive option since a redesigned larger and slower chip is required. Some embodiments described herein try to bridge this gap using breakout area 133 (e.g., as shown in FIG. 1B), and/or by providing some new process flows that can be integrated into the circuit board manufacturing process.

FIG. 1B shows chip 123 with chip footprint 128 including first interconnect zone 124 at location 127 on surface 122. Zone 128 has area 129, length L2 and width W2 on or at surface 122. Zone 124 may include interconnects, contacts (e.g., contact pads) having a first pitch at surface 122. Zone 124 includes first exposed contacts 125 having a first pitch 126 at or on surface 122. Pitch 126 may be defined as the distance between center points of adjacent contacts 125; as an average of the distances between center points of all contacts 125; or a pitch determined by a design rule (DR) contacts 125; or a pitch of contacts 125 as know in the art. The center points may be geographically calculated center location of the exposed area of a contact from above, or determined otherwise as know in the art.

Surrounding chip 123 or zone 124 is breakout area 133 including second interconnect zone 134 at location 107 on surface 122. Area 133 may have inner length L2 and width W2 on or at surface 122; and outer length L1 and width W1 on or at surface 122. Area 133 may be an area equal to (L1×W1)−(L2×W2).

Area 133 may include interconnects, contacts (e.g., contact pads) having a second pitch at surface 122. Area 133 includes second exposed contacts 135 having a second pitch 136 at or on surface 122. Pitch 136 may be defined with respect to contacts 135, similar to how pitch 126 is defined with respect to contacts 125.

Area 133 may be defined as an area (or interconnect zone) between area 129 (or zone 124) and area 109 (or zone 108). Area 133 may includes zone 134 having contacts 135 which are electrically connected to contacts of chip 123, or traces connected to chip 123. In some cases, contacts 135 are conductive wires, routing or traces extending (e.g., along material of surface 122, or another material or gap) from interconnects, contacts, or other electronic devices on or in the chip to contacts 125 on surface 122. In some cases, contacts 135 do not include actual contacts that will be directly contacted to by contacts of chip 123, but only include conductive wires, routing or traces extending (e.g., along material of surface 122) from interconnects, contacts, or other electronic devices on or in the chip to contacts 125.

In some cases, area 133 completely surrounds all sides of area 129 on surface 122. In some cases, first pitch 126 is smaller than the second pitch 136.

Chip 123 is directly mounted on surface 122. Chip 123 occupies first interconnect zone 124 or area 129 of the surface 122 at location 127. In some cases, location 127 is within or completely surrounded by location 107. In some cases area 129 is within or completely surrounded by area 133. In some cases, zone 124 is within or completely surrounded by zone 134.

Mounting of chip 123 may include physically attaching or bonding a bottom surface of chip 123 to surface 122. Such attaching may include epoxy, resin, other adhesive or attaching as know in the art. Mounting of chip 123 may include electrically connecting, physically attaching or bonding electrical contacts on a bottom surface of the chip to exposed contacts 125 on surface 102. These electrical connections may include solder, ball grid array, conductive adhesive or other electrical connections as know in the art. Mounting of chip 123 may include electrically connecting contacts on a bottom surface, side surface, and/or top surface of chip 123 to exposed contacts 125 on surface 102. Such electrical connecting may include solder on die formed on contacts of chip 123, and attaching the solder on die to contacts 125. Such attaching may use soldering or other methods know. These electrical connections may include solder, ball grid array, conductive adhesive or other electrical connections as know in the art. Such connecting may include using wires, routing or traces extending (e.g., along material of surface 122, or another material or gap) from interconnects, contacts, or other electronic devices on or in the chip to contacts 125 on surface 122. In some embodiments, contacts 135 include or are such wires, routing and traces.

Board 120 may include layers dielectric interconnects and contacts (e.g., contact pads) as known in the art. The interconnects and contacts of board 120 may be formed on or within one or more layers of dielectric 101. The interconnects of zones 124 and 134; and contacts of 124 and 134 may be formed on or within a top layer of dielectric 101. Board 120 may be a circuit board, motherboard, or another board upon which an IC chip, or microprocessor, or CPU can be mounted. Dielectric material 101, and other dielectric materials or layers of board 120 may include one or more layers of non-conductive material, pre-preg, base core, resin, and/or epoxy as known in the art. The interconnects, contacts, and conductor materials or layers of board 120 may be formed of a conductive material as known in the art. In some cases, appropriate conductive materials include copper, nickel, gold, gold, palladium, an alloy thereof, and the like as known in the industry. Circuit board 120 may include more (e.g., two or three) interconnect zones 124 and 134 than those shown.

As shown in FIG. 1B, embodiments may locally integrate some aggressive DR in zone 124 (DR comparable to that of the substrate package) and then transitions it to DR in zone 134, comparable to that of the motherboard. In some cases, forming contacts 125 may include forming the contacts using processing (e.g., electronic device fabrication processing so that the contacts satisfy the DR) according to a design rule appropriate for direct chip attachment (DCA) of integrated circuit chip contacts to contacts of a substrate or interposer, such as a DR for chip attachment to a substrate package or interposer to be mounted onto a circuit board (e.g., motherboard). In some cases, forming contacts 135 may include forming the contacts using processing according to a design rule appropriate for direct attachment of substrate package or interposer contacts to contacts of a circuit board, such as a DR for substrate or interposer attachment to a motherboard.

Moreover, it can be appreciated that forming contacts 125 and/or 135 may include forming hundreds of contacts in zones 124 and 125, such as formed on a wafer as known in the art. Also, it can be appreciated that forming layers 222, 232 and 242 may include forming hundreds or thousands of interconnects in each layer, such as formed on a wafer as known in the art.

According to some embodiments, a motherboard will require one or two breakout layers for enabling the DCA, and the proposed circuit board device or process flow will have or create those two layers. According to some embodiments, two separate process flows have been proposed out of which either one can be employed. According to embodiments, two technology components that may enable forming board 120 include: (i) transfer of finer or smaller pitch break-out patterns of interconnects for interconnect layers, and (ii) laser scribing process such as laser projection and patterning (LPP) ablated traces. For example, FIGS. 2A-E may describe devices and processes for transferring a pattern of contacts on pre-preg based core; and FIGS. 3A-E may describe devices and processes for patterning traces created by a LLP and filled with copper before copper etching, and after copper etching.

FIGS. 2A-E may include embodiments of a schematic depiction of a pattern transfer process or flow to enable shrink DR in breakout area of the motherboard for DCA of an IC chip. Embodiments of a process to form the fine patterned break-out on the sacrificial substrate are describe for FIG. 2C.

FIGS. 2A-E may include embodiments of where the fine pattern of break-out (e.g., having contacts 125) is manufactured in a separate sacrificial substrate (e.g., substrate 320) and then the fine pattern is later transferred (e.g., flip bonded) to the motherboard (e.g., board 120) at the location (X-Y) (e.g., location 127 or zone 124 or area 129) where the fine pattern is desired. The transfer may happen before the Prepreg (e.g., dielectric layer 256) is fully cured. In some cases, after transfer of the fine pattern, the rest of the layer manufacturing process (e.g., FIG. 2E, an so on) remains the same.

FIG. 2A shows a cross-sectional side view schematic of a circuit board having interconnect layers. FIG. 2A shows a cross-sectional schematic of board 120, having interconnect layer 222, over interconnect layer 232, which is over interconnect layer 242.

In some cases, layer 222 has interconnects 224 formed through dielectric material of layer 222 and contacts 228 upon the surface of layer 222. In some cases, layer 222 includes a layer of dielectric material, a plurality of interconnects 224 at a first (e.g., bottom in this case) surface of the layer of dielectric material and a plurality of contacts 228 at a second (e.g., top in this case) surface of the layer of dielectric material. In some cases, layer 222 has openings 229 through or between contacts 228 upon the surface of layer 222. Openings 229 may extend to or expose dielectric of layer 222.

In some cases, layer 232 has interconnects 234 formed through dielectric material of layer 232 and contacts 238 upon the surface of layer 232. In some cases, layer 232 includes a layer of dielectric material, a plurality of interconnects 234 at a first (e.g., bottom in this case) surface of the layer of dielectric material and a plurality of contacts 238 at a second (e.g., top in this case) surface of the layer of dielectric material. In some cases, some or all of contacts 238 are attached to or electrically connected to interconnects 224 of layer 222.

In some cases, layer 242 has interconnects 244 formed through dielectric material of layer 242; and has contacts 248 and 258 upon opposing surfaces of layer 242. In some cases, layer 242 includes a layer of dielectric material, a plurality of interconnects 244 within the layer of dielectric material, a plurality of contacts 248 at a first (e.g., top in this case) surface of the layer of dielectric material, and a plurality of contacts 258 at a second (e.g., bottom in this case) surface of the layer of dielectric material.

In some cases, some or all of contacts 248 are attached to or electrically connected to interconnects 234 of layer 232. In some cases, layer 242 has openings 249 through or between contacts 258 upon the surface of layer 242. Openings 249 may extend to or expose dielectric of layer 242. Openings 249 may be formed by known processes.

FIG. 2A also shows zone 124 and 134, dielectric 101, and contacts 258 along the bottom surface of board 120. Circuit board 120 may include more (e.g., two to a dozen more) or fewer (e.g., may only have two or three) interconnect layers than those shown. According to some embodiments, FIG. 2A may show making of the board 120 to the (N−1) layer (e.g., layer 222) for break-out routing (e.g., the copper layer, such as contacts 228, just below break-out routing (e.g., contacts 125).

FIG. 2B shows a cross-sectional side view schematic of the circuit board of FIG. 2A after forming a dielectric layer over; and dielectric and a conductive layer under the interconnect layers. FIG. 2B shows dielectric layer 256 formed over or on openings 229, contacts 228, interconnects 224, and dielectric of layer 222. FIG. 2B also shows dielectric layer 266 formed over or on openings 249, contacts 258, interconnects 244, and dielectric of layer 242. Conductor layer 278 is shown formed on a bottom surface 274 of dielectric layer 266. According to some embodiments, FIG. 2B may show lamination of pre-preg (e.g., dielectric layer 266) with copper foil (e.g., conductor 278) onto the back side of motherboard (e.g., surface 274, where no break-out routing is needed), and lamination of pre-preg (e.g., dielectric layer 256) with no copper foil onto the front side of substrate (e.g., on layer 222).

FIG. 2C shows a cross-sectional side view schematic of a transfer substrate for transferring to a surface of the circuit board of FIG. 2B. FIG. 2C shows transfer substrate 320, including dielectric 328 and contacts 125, formed on dielectric 328. Dielectric 328 may be silicon or glass material having a planar surface and an annular radius (e.g., an annular outer perimeter or annular shaped surface area). In some cases, contacts 125 are patterned copper traces and contacts formed onto the surface of dielectric 328, or a material formed on dielectric 328 that allows dielectric 328 to be removed from board 120 and contacts 125 without damaging board 120 and contacts 125. Contacts 125 may have pitch 126 and be within zone 124.

According to some embodiments, FIG. 2C may show a pattern on a transferable substrate (e.g., substrate 320) for transferring of the breakout routing (e.g., contacts 125, such as patterned copper traces or contacts onto the surface) from the transferable substrate to the board (e.g., surface 272). According to some embodiments, FIG. 2C may include manufacturing a fine pattern of break-out (e.g., having contacts 125) in a separate sacrificial substrate (e.g., substrate 320).

According to some embodiments, substrate 320 may be formed by processing or preparing a sacrificial substrate having dielectric 328 including the following. A surface of dielectric 328 may be lithographically patterned with the breakout pattern or pattern of contacts 125. Then, the pattern of conductor (e.g., pattern of contacts 125) may be plated onto the surface of dielectric 328 (e.g., upside down). Plating may include copper patterning or patterning of copper traces onto the surface. Then a dry file resist (DFR) strip may be performed (e.g., to remove the patterning). Then, the plated substrate may be singulated to produce a number of substrate 320s.

FIG. 2D shows a cross-sectional side view schematic of the circuit board of FIG. 2B after transferring the patter of contacts from the substrate of FIG. 2C to a surface of the circuit board of FIG. 2B. FIG. 2D shows transfer substrate 320 flipped and bonded to dielectric 256 of board 120. Contacts 125 of substrate 320 may be attached to or electrically connected to interconnects 224 or contacts 228 of interconnect layer 222. Substrate 320 may be "flip chip bonded" to surface 272 of dielectric 256. The transfer may happen before the Prepreg (e.g., dielectric layer 256) is fully cured.

According to some embodiments, substrate 320 may be formed by processing or preparing a sacrificial substrate having dielectric 328 including the following. Forming a seed layer upon surface 329 of dielectric 328. The seed layer (e.g., 1 micron thick) may include paladium, copper, and/or other know seed material upon which to form conductor material of contacts 125. Next, a dry film (e.g., resist) patterning material may be formed on the seed layer. In some cases, this may be done as know in the art. Next, openings may be formed in the dry film patterning material in a pattern according to the first design rule, such as to form the pattern where contacts 125 will be formed. In some cases, this include lithograpical patterning and forming openings in the film according to the first design rule. This pattern may have pitch 126. In some cases, this may be done as know in the art. Next, copper is plated in the pattern or openings between the surviving film, such as by electrolytic bath or plating. Later, the dry film may be dissolved, such as by dry file resist (DFR) removal. In some cases, this may be done as know in the art.

According to some embodiments, contacts 125 may be transferred to board 120 by processing using substrate 320 including the following. Contacts 125 of substrate 320 are bonded to dielectric 256. In some cases, this bonding may optionally bond or electrically connected contacts 125 to traces, interconnects or routing in dielectric 256. In come cases, if contacts 135 are already formed, this bonding may optionally bond or electrically connected contacts 125 to contacts 135 (e.g., traces, interconnects or routing of contacts 135), before dielectric 256 is cured. In some cases, this bonding may include pressing substrate 320 into uncured surface 272 of dielectric 256 until the surface 329 of dielectric 328 and top surface 272 are coplanar. In some cases, this bonding may include embedding contacts 125 into uncured layer 256 so that the surface of contacts 125 attached to surface 329 become coplanar with surface 272. In some cases, this bonding may include pressing substrate 320 into surface 272 of dielectric 256 with enough pressure to embed contacts 125 into a thickness of 256 equal to the thickness of contacts 125.

Next, dielectric 256 is cured, such as by heating. Next, dielectric 256 may be cured, while surface 329 of dielectric 328 is coplanar with surface 272. Curing may be by heating the structure shown in FIG. 2D until the dielectric 256 is cured. Next, dielectric 328 is removed, such as by etching. In some cases, this may be done as know in the art.

FIG. 2D also shows board 120 after removing substrate 320, but not removing contacts 125 from surface 272 of dielectric 256. Contacts 125 are shown exposed on top surface 272 of dielectric layer 256. In some cases, some or all of contacts 125 are attached to or electrically connected to contacts 135; interconnects or contacts of layers 242, 232 and or 222. In some cases, some or all of contacts 125 are attached to or electrically connected to contacts 228 of layer 222. In some cases, some or all of contacts 125 are attached to or electrically connected to contacts 135.

According to some embodiments, FIG. 2D may show a pattern of the breakout routing (e.g., contacts 125) transferred (e.g., by substrate 320) from the transferable substrate and released from the sacrificial substrate onto the circuit board (e.g., onto surface 272). After transfer of the pattern, one or more next layers of finer break-out can be built onto surface 272, if desired.

According to some embodiments, FIG. 2D may include transferring (e.g., flip bonding) a fine pattern of break-out (e.g., having contacts 125) to the motherboard (e.g., board 120) at the location (X-Y) (e.g., location 127 or zone 124 or area 129) where the fine pattern is desired. In some cases, after transfer of the fine pattern, the rest of the layer manufacturing process (e.g., FIG. 2E, an so on) remains the same for board 120, as it was without the process of FIGS. 2B-C. According to some embodiments, FIG. 2D may include transferring (e.g., flip bonding) a fine pattern of break-out (e.g., having contacts 125) of interconnects onto a surface below the interconnect zone 124 prior to curing a dielectric material of the circuit board (e.g., dielectric 256).

FIG. 2E shows a cross-sectional side view schematic of the circuit board of FIG. 2D after removing the transfer or sacrificial substrate to form contacts in the first interconnect zone having a pitch smaller than contacts on the rest of the circuit card. FIG. 2E shows board 120 after removing substrate 320, but not removing contacts 125 from surface 272 of dielectric 256. Thus, contacts 125 are exposed on surface 272 prior to forming contacts 135, and forming solder pattern 450 on surface 272. Then, contacts 135 and solder pattern 450 are formed on surface 272. In some cases, contacts 135 are conductive wires, routing or traces extending (e.g., along material of surface 122, or another material or gap) from interconnects, contacts, or other electronic devices on or in the chip to contacts 125 on surface 122.

Contacts 428 are shown below opening 449 and are exposed through pattern 450. Forming contacts 428 may include forming interconnects 414 through dielectric 256. Contacts 428 may include power and grounding contacts as known.

Opening 449 and contacts 429 may represent a number of openings. Opening 449 may also represent a number of contact 125 openings for electically connecting contacts of chip 123 to contacts 125. Such contact 125 openings may have pitch 126 in zone 124, and may have a size (e.g., area at surface 122) appropriate for such electical connections. Opening 449 may be formed by lithographic patterning of pattern 450 as known in the art.

Contacts 425 and solder pattern 451 are also shown formed on a bottom surface of dielectric 266. Forming contacts 425 and solder pattern 451 may include removing or patterning conductor 278. Forming contacts 425 may include forming interconnects 424 through dielectric 266.

In some cases, some or all of interconnects 424 are attached to or electrically connected to interconnects or contacts of layers 242, 232 and or 222. In some cases, some or all of interconnects 424 are attached to or electrically connected to contacts 258 of layer 242.

In some cases, some or all of contacts 425 are attached to or electrically connected to interconnects or contacts of layers 242, 232, 222 and or interconnects 424. In some cases, some or all of contacts 425 are attached to or electrically connected to interconnects 424.

According to some embodiments, FIG. 2E may show formation of plan of record (POR) via and pattern (e.g., contacts 425 and pattern 451) and then solder radius (SR) layer patterning (e.g., pattern 450) and BGA side solder resist opening (SRO) formation (e.g., opening 449). According to some embodiments, POR may refer to processing, DR, vias, interconnects, interconnect layers, or pitch as described for the second pitch or forming contacts 135.

According to some embodiments, FIGS. 2A-E may show forming contacts 125 by transferring a transfer substrate having the contacts onto the surface of the circuit board, wherein transferring includes transferring the contacts (1) into a dielectric material of the circuit board below the surface of the circuit board prior to curing the dielectric material of the circuit board and (2) within the first interconnect zone (e.g., see FIG. 2C-D). In some cases, transferring may include, after transferring and curing, removing the transfer substrate from the surface of the circuit board and leaving the contacts below the surface of the circuit board (e.g., see FIG. 2E). In some cases, contacts 135 are formed in the second zone after forming contacts 125, such as by patterning and etching conductor to form contacts 135 at locations within the second zone (e.g., see FIG. 2E).

FIGS. 3A-D may include embodiments of a schematic depiction of a process or flow to enable a shrink DR in breakout area of the motherboard for DCA of an IC chip. FIGS. 3A-D may include embodiments of where the fine pattern of break-out (e.g., having contacts 125) is formed by scribing the break-out DR contact vias (e.g., where contacts 125 will be formed) using a laser process (e.g., such as Laser Projection and Patterning (LPP)). The fine patter scribing can be performed on a surface of the motherboard (e.g., board 120) at the location (X-Y) (e.g., location 127 or zone 124 or area 129) where the fine pattern is desired. Then the scribed pattern trenches can be filled with copper via electroless and electrolytic plated copper. The plated copper can then be patterned and etched to leave contacts 125 and 135. In addition, the over-plated copper can be used in formation of the POR layer patterning (e.g., forming contacts 135 and/or 425). In some cases, after forming the fine pattern (e.g., contacts 125_, the rest of the layer manufacturing process (e.g., FIG. 3D, an so on) remains the same.

FIG. 3A shows a cross-sectional side view schematic of a circuit board having interconnect layers. FIG. 3A may be equal to FIG. 2A.

FIG. 3B shows a cross-sectional side view schematic of the circuit board of FIG. 3A after forming a dielectric layer over interconnect layers, forming a dielectric layer under the interconnect layers, and laser drilling vias in at least the top dielectric layer. FIG. 3B shows dielectric layer 256 formed over or on openings 229, contacts 228, interconnects 224, and dielectric of layer 222. FIG. 3B also shows dielectric layer 266 formed over or on openings 249, contacts 258, interconnects 244, and dielectric of layer 242. Layer 266 has bottom surface 274.

According to some embodiments, FIG. 3B may show pre-preg (e.g., dielectric layer 256) laminated onto layer 222 with no copper foil on front side of substrate (e.g., on layer 222), and pre-preg (e.g., dielectric layer 266) laminated onto layer 242 with no copper foil (e.g., without conductor 278) on the back side of motherboard. In some cases, there may be copper foil (e.g., conductor 278) dielectric 266.

According to some embodiments, FIG. 3B may show laser via drilling (e.g., using LPP or another appropriate laser drilling technology) laser vias 529 into a portion of the thickness of dielectric 256. In some cases, laser vias 529 only extend into a portion of the thickness of dielectric 256. In some cases, some of laser vias 529 only extend into a portion of the thickness of dielectric 256, while others (or the rest) extend through the entire thickness of dielectric 256.

Figure 3C:
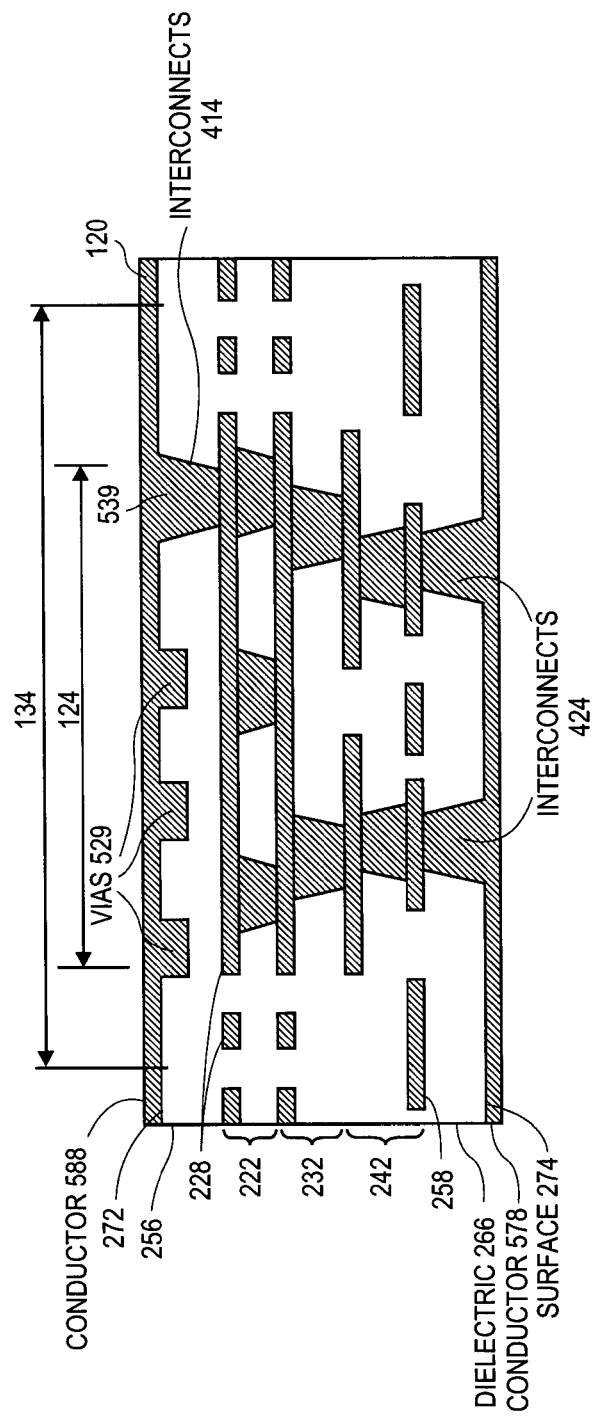
FIG. 3C shows a cross-sectional side view schematic of the circuit board of FIG. 3B after filling the vias and openings with conductor.

According to some embodiments, FIG. 3B may include laser scribing a pattern of trenches of the first interconnects (e.g., contacts 125) onto surface 272 of the interconnect zone 124 prior to forming first interconnect conductors (e.g., contacts 125) in the pattern of trenches (e.g., prior to FIG. 3C). According to some embodiments, FIG. 3B may include laser projection and patterning (LPP) ablated traces of a pattern of trenches of the first interconnects (e.g., contacts 125) into a surface of the interconnect zone 124 prior to plating a conductor onto the trenches (e.g., prior to FIG. 3C).

Vias 529 may be a pattern of the breakout routing (e.g., for contacts 125, such as a patterned of vias to be filled with copper to form copper traces or contacts onto the surface 272 of dielectric 256). According to some embodiments, laser scribing a pattern of trenches to form contacts 125 includes scribing a dielectric (e.g., dielectric 256), solder resist, or dry resist. Later, a laser is used to burn or drill holes or a patterns in dielectric 256 at locations for contacts 125. The laser may be a laser for such functions as know in the art.

The holes or a patterns in dielectric 256 may be formed in a pattern according to the first design rule, such as to form the pattern where contacts 125 will be formed. In some cases, this includes forming openings according to the first design rule. This pattern may have pitch 126. In some cases, this may be done as know in the art.

In some cases, openings 539 are formed into or through dielectric 256. Openings 539 may extend to or expose contacts 228 or interconnects of layer 222. Openings 539 may be formed by known processes. In some cases, openings 569 are formed into or through dielectric 266. Openings 569 may extend to or expose contacts 258 or interconnects of layer 242. Openings 569 may be formed by known processes.

FIG. 3C shows a cross-sectional side view schematic of the circuit board of FIG. 3B after filling the vias and openings with conductor. FIG. 3C shows laser vias 529 and openings 539 filled with conductor layer 588, such as by filling the vias and openings during a single process or plating process. In some cases, copper may be built into the holes or pattern by copper plating. Filling via 529 may include forming interconnects 414 through dielectric 256. Interconnects 414 may be attached to or electrically connected to interconnects 224 and/or contacts 228 of interconnect layer 222.

In some cases, openings 569 are also filled with conductor layer 578. In some cases, openings 569 are filled during the same process as openings 539 and vias 529. Filling openings 569 may include forming interconnects 424 through dielectric 266. Interconnects 424 may be attached to or electrically connected to interconnects 244 and/or contacts 248 of interconnect layer 242. In some cases, some or all of interconnects 424 are attached to or electrically connected to interconnects or contacts of layers 242, 232 and or 222. In some cases, some or all of interconnects 424 are attached to or electrically connected to contacts 258 of layer 242.

Figure 3D:
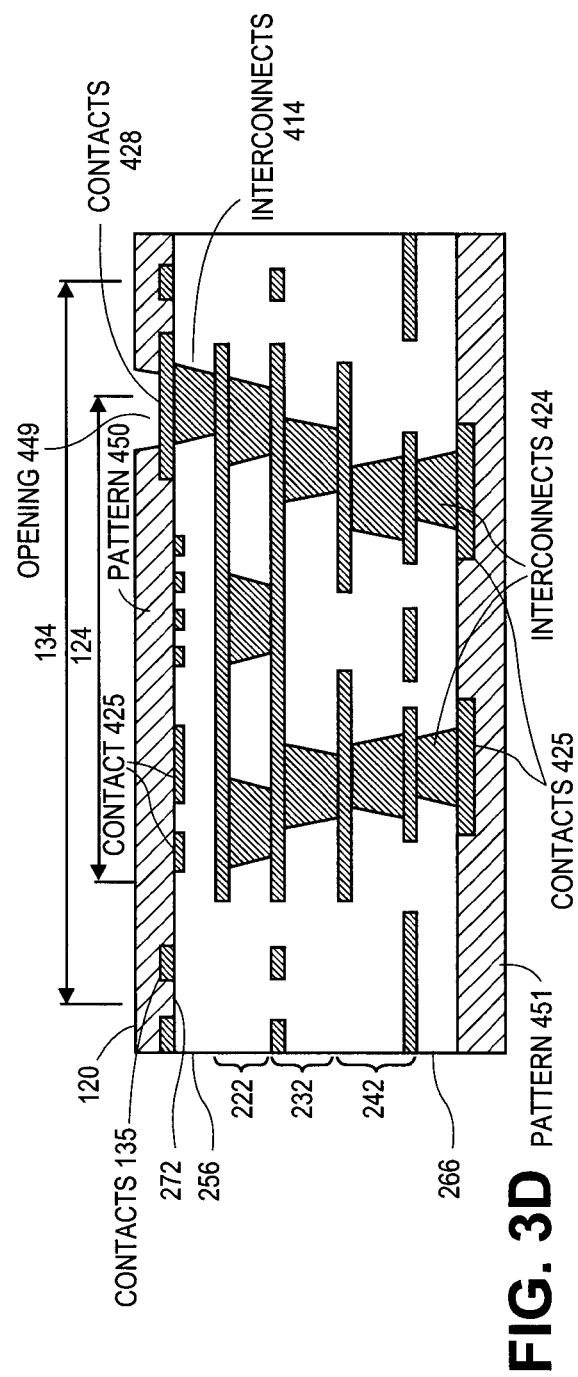
FIG. 3D shows a cross-sectional side view schematic of the circuit board of FIG. 3C after etching or removing portions of the conductor formed on the dielectric layers to form contacts, and forming solder patterns over the board surfaces.

According to some embodiments, FIG. 3C may include filling trenches (e.g., vias 529) with copper via electro-less and electrolytic plating of copper. In some cases, the conductor may be plated using copper plating techniques. According to some embodiments, FIG. 3C may include electroless and electrolytic copper plating to fill the laser vias in the breakout trench pattern. According to some embodiments, FIG. 3C may include semi subtractive patterning using a DFR laminated onto dielectric 256 and then patterned, before the electrolytic plating is applied FIG. 3D shows a cross-sectional side view schematic of the circuit board of FIG. 3C after etching or removing portions of the conductor formed on the dielectric layers to form contacts, and forming solder patterns over the board surfaces. FIG. 3D may include etching or removing portions of conductor 588 formed on dielectric layer 256 to form contacts 125 in zone 124. This etching may be done using known processes for forming contacts having a size and pitch of contacts 125. Contacts 125 may be attached to or electrically connected to interconnects 239, interconnects 224 or contacts 228. In some cases, some or all of contacts 135 are attached to or electrically connected to interconnects or contacts of layers 242, 232 and or 222. In some cases, some or all of contacts 135 are attached to or electrically connected to contacts 228 of layer 222.

FIG. 3D may also include etching or removing portions of conductor 588 formed on dielectric layer 256 to form contacts 135 in zone 134. This etching may be done using known processes for forming contacts having a size and pitch of contacts 135. Contacts 135 may be attached to or electrically connected to interconnects 239, interconnects 224 or contacts 228.

In some cases, removing portions of conductor 588 includes a process that forms contacts 125 as a pattern of copper traces or contacts onto the surface of dielectric 256, without damaging board 120, dielectric 256, contacts 125 or contacts 135. Contacts 125 may have pitch 126 and be within zone 124; and Contacts 135 may have pitch 136 and be within zone 134.

In some cases, removing portions of conductor 588 includes copper etching as known in art to form contacts 125 and 135. In some cases, removing portions of conductor 588 includes removing a top layer of conductor 588 (e.g, by etching or planarizing) to leave conductor in vias 529 (e.g., to form contacts 125. and 539 (e.g., to form contacts 428). Then, surface 272 in zone 134 is patterned and etched according to the second design rule to form contacts 135.

FIG. 3D may include etching or removing portions of conductor 578 formed on dielectric layer 266 to form contacts 425 on surface 274. This etching may be done using known processes for forming contacts having a size and pitch of contacts 425. Contacts 425 may be attached to or electrically connected to interconnects 424, interconnects 244 or contacts 248. In some cases, some or all of contacts 425 are attached to or electrically connected to interconnects or contacts of layers 242, 232, 222 and or interconnects 424. In some cases, some or all of contacts 425 are attached to or electrically connected to interconnects 424.

Contacts 125 and 135 are shown exposed on top surface 272 of dielectric layer 256, prior to forming pattern 450. In some cases, some or all of contacts 125 and 135 are attached to or electrically connected to interconnects or contacts of layers 242, 232 and or 222. After forming contacts 125 and 135, one or more next layers of finer break-out can be built onto surface 272, if desired.

In some cases, after forming contacts 125 and 135, the rest of the layer manufacturing process (e.g., forming patterns 450 and 451, an so on) remains the same for board 120, as it was without the process of FIGS. 3B-C. According to some embodiments, FIG. 3D may include forming a fine pattern of break-out (e.g., having contacts 125) of interconnects onto a surface below the interconnect zone 124 after curing a dielectric material of the circuit board (e.g., dielectric 256).

According to some embodiments, FIG. 3D, contacts 125 and 135 are exposed on surface 272 prior to forming solder pattern 450 on surface 272. Then, solder pattern 450 is formed on surface 272. Contacts 428 are shown below opening 449 and are exposed through pattern 450. Forming contacts 428 may include forming interconnects 414 through dielectric 256.

Contacts 425 and solder pattern 451 are also shown formed on a bottom surface of dielectric 266. Forming contacts 425 and solder pattern 451 may include removing or patterning conductor 278. Forming contacts 425 may include forming interconnects 424 through dielectric 266.

According to some embodiments, FIG. 3D may include patterning of the copper (e.g., conductor 588 and 578) on the outer most layer of board 120 and then solder radius (SR) layer patterning (e.g., pattern 450) and BGA side solder resist opening (SRO) formation (e.g., opening 449).

According to some embodiments, FIGS. 3A-D may describe forming contacts 125 by laser scribing a pattern of trenches, at locations for the first contacts, into a surface of the circuit board and within the first interconnect zone (e.g., FIG. 3B); then forming conductive material in the patterned trenches to form the first contacts (e.g., FIGS. 3C-D). In some cases, the laser scribing includes laser projection and patterning (LPP) ablated traces of a pattern of trenches of the first contacts into a surface of the first interconnect zone (e.g., FIG. 3B); and forming conductive material includes filling the trenches with copper using electro-less or electrolytic plating of copper (e.g., FIG. 3C). In some cases, contacts 135 are formed in the second zone during forming contacts 125, such as during etching of the conductive material (e.g., see FIG. 3C-D).

FIGS. 2E and 3D show pattern 450 and 451 such solder resists formed on the exterior surface of, and in between contacts on surfaces of dielectrics 256 and 266. Such solder resists may be a solder resist protective coating on the exterior surface of the package. Such solder resists may cause the flux spray to form only where the constraints do not exist, thus directing the spray material onto the contacts to form BGAs on and touching the contacts (e.g., at openings 449 and 569). The function of Solder resist (SR) may also be to prevent any electrical shortage, such as to prevent shortage between contacts on surfaces of dielectrics 256 and 266. Forming patterns 450 and 451 may include forming panel constraints, after which paste printing for ball grid array (BGA) attachments is performed, as known in the art.

According to some embodiments, after forming board 120 as shown in FIG. 2E or 3D, chip 123 is mounted on zone 124 and/or electronically attached to contacts 125 (e.g., see FIG. 1B). In some cases, chip 123 is mounted onto surface 122 in area 129 and electrically connected to contacts 125. According to some embodiments, after forming board 120 as shown in FIG. 2E or 3D, board 120 is configured for direct chip attach (DCA) of an integrated circuit chip to contacts 125.

According to some embodiments, electronically attaching the chip to contacts 125 includes routing 600 signal lines through two (contacts 125 and 135) or three interconnect layers of the circuit board. In some cases, the circuit board is for mounting in one of a tablet computer, a smartphone, and a value phone.

According to some embodiments, the pitch for contacts 125 has a pitch distance (e.g., as noted above, or between midpoints of the contacts 125) of between 120 and 160 microns. In some cases, the pitch for contacts 125 has a pitch distance of between 130 microns and 150 microns.

In either of these cases, according to some embodiments, the pitch for contacts 135 has a pitch distance (e.g., as noted above, or between midpoints of the contacts 135) of between 390 microns and 410 microns. According to some embodiments, the pitch for contacts 125 is between 30 and 40 percent as large the pitch for contacts 135. In some cases, contacts 125 have a spacing between them of between 1 and 10 microns. In some cases, contacts 125 have a spacing between them of between 50 and 100 microns.

In some cases, zone 124 has a square outer perimeter having side lengths (e.g., L2 equal to W2) of between 9 mm and 11 mm. In some cases, zone 124 has a rectangular outer perimeter having each side length (e.g., L2 not equal to W2) of between 9 mm and 11 mm. In some cases, zone 124 has a circular or oval outer perimeter having a diameter length (e.g., not shown) of between 9 mm and 11 mm.

In some cases, zone 134 has a square outer perimeter having side lengths (e.g., L1 equal to W1) of between 14 or 15 mm and 17 or 18 mm (and an inner perimeter equal to any of those described above for zone 124). In some cases, zone 134 has a rectangular outer perimeter having each side length (e.g., L1 not equal to W1) of between 14 or 15 mm and 17 or 18 mm (and an inner perimeter equal to any of those described above for zone 124). In some cases, zone 134 has a circular or oval outer perimeter having a diameter length (e.g., not shown) of 14 and 18 mm (and an inner perimeter equal to any of those described above for zone 124). According to some embodiments, zone 124 has a square outer perimeter side lengths that are between 57 and 67 percent as large as the zone 134 square outer perimeter side lengths.

In some cases, the inner perimeter of zone 134 completely surrounds the outer perimeter of zone 124 on surface 122 of the circuit board. In some cases, the inner perimeter of area 133 completely surrounds the outer perimeter of area 129 on surface 122 of the circuit board.

Some embodiments described herein provide an approach to enable direct chip attach to motherboard, without using a substrate (e.g., without using a package or packaging). For this neither the motherboard technology does not need to scale entirely nor, the silicon has to accommodate relaxed bump pitch at the financial or performance expenses or both. This can be adopted for smartphones, value phones or, tablet segments of products. Some embodiments described herein provide a cost effective solution for DCA using the existing MB technology with minor additive technology, the cost of which will be significantly lower than the substrate BOM cost.

Also, embodiments described herein allow for the routing of up to 600 signals in two layers (e.g., zones 124 and 134), whereas the current board design will take four layers of motherboard for the same I/O count (with more relaxed DR). In some cases, the embodiments allow for attaching the chip directly to the motherboard without significantly changing the platform or board design. Also this technology can provide better financial affordability than changing the platform or board design.

Figure 4:
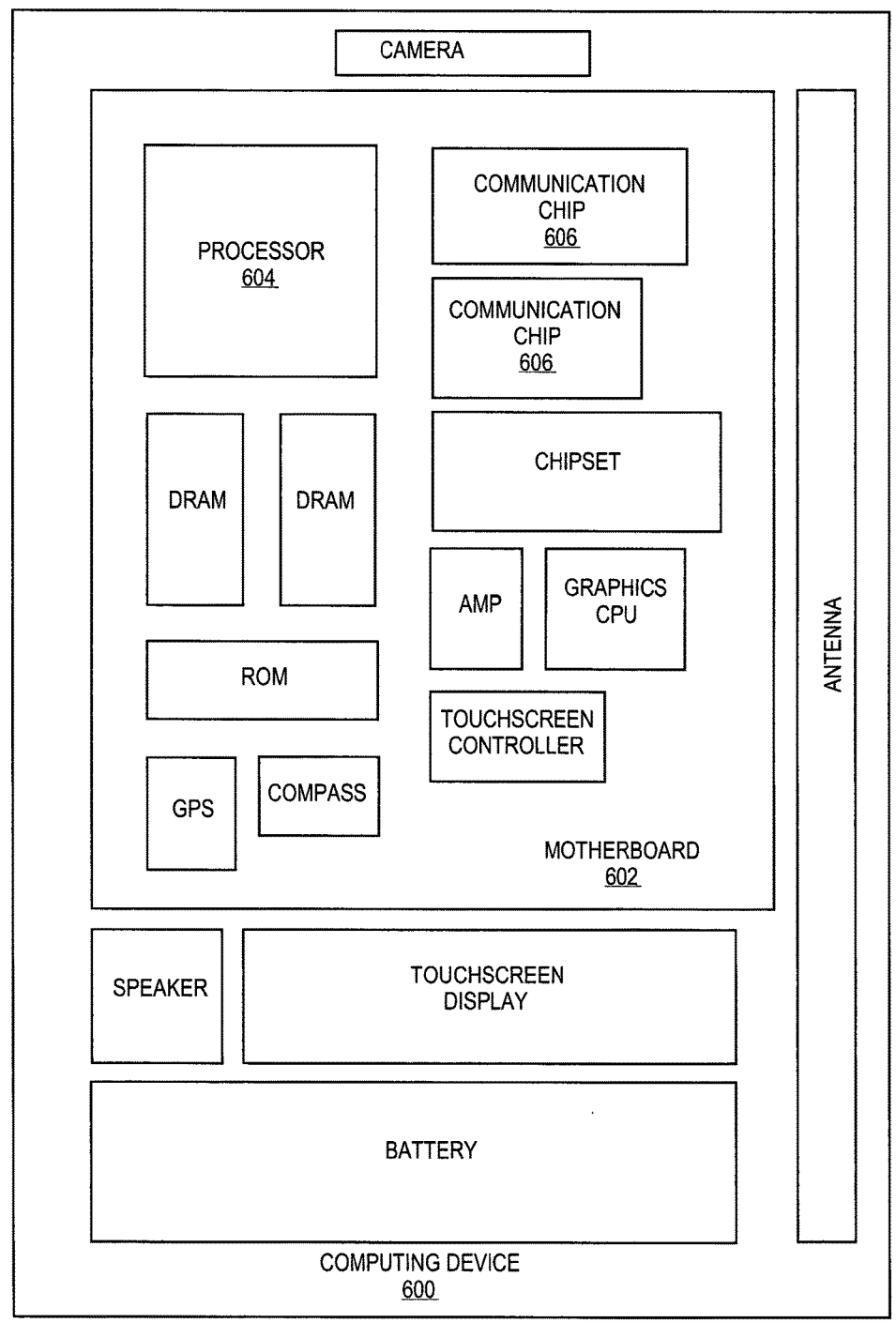
FIG. 4 illustrates a computing device in accordance with one implementation.

FIG. 4 illustrates a computing device 600 in accordance with one implementation. The computing device 600 houses board 602. Board 602 may include a number of components, including but not limited to processor 604 and at least one communication chip 606. Processor 604 is physically and electrically connected to board 602. In some implementations at least one communication chip 606 is also physically and electrically connected to board 602. In further implementations, communication chip 606 is part of processor 604.

Depending on its applications, computing device 600 may include other components that may or may not be physically and electrically connected to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Board 602 may be a circuit board upon which to mount an integrated circuit chip (e.g., processor 604) and may include a first interconnect zone on the surface of the circuit board having first contacts with a first pitch, and a second interconnect zone, surrounding the first zone, having second contacts with a second pitch that is smaller than the first pitch. The first contacts may have a design rule (DR) for direct chip attachment (DCA) processor 604. The first contacts may be formed as noted in FIG. 2 or 3. Processor 604 may be a smaller footprint processor chip (e.g., then a processor or CPU for a desktop computer), such as a processor for devices, such as tablet computers, cell phones, smart phones, and value phone devices. In some cases, the term "processor" may refer to any device or portion of a device that processes electronic data from registers and/or memory to transform that electronic data into other electronic data that may be stored in registers and/or memory.

Communication chip 606 also includes an integrated circuit die packaged within communication chip 606. In accordance with another implementation, a package including a communication chip incorporates one or more fin devices having cladding device layers such as described above. In further implementations, another component housed within computing device 600 may contain a typical motherboard for a computing device (e.g., not having zone 124).

In various implementations, computing device 600 may be a tablet computer, cell phone, smart phone, or value phone device. In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the embodiments of the invention but to illustrate it. The scope of the embodiments of invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe two pitches of contacts for two zones, the technology can be applied to form three or more zones with different pitches. Thus, the claims following the Detailed Description are hereby expressly incorporated into this Detailed Description, with each claim standing on its own as a separate embodiment of the invention.

What is claimed is:

1. A method of forming a circuit board upon which to mount an integrated circuit chip, the method comprising:
    forming a first interconnect zone on a surface of the circuit board, the first interconnect zone having a first area on the surface of the circuit board, the first interconnect zone including a first plurality of contacts having a first pitch at the surface of the circuit board; and
    forming a second interconnect zone on the surface of the circuit board, the second interconnect zone having a second area on the surface of the circuit board, the second area having an inner perimeter surrounding all sides of an outer perimeter of the first area on the surface, the second interconnect zone including a second plurality of contacts or traces having a second pitch at the surface of the circuit board, wherein the first pitch is a distance from a center of one contact of the first plurality of contacts to a center of an adjacent contact of the first plurality of contacts; and the second pitch is a distance from a center of a first contact or trace of one of the second plurality of contacts or traces to a center of an adjacent contact or trace of the second plurality of contacts or traces, and wherein the first pitch is smaller than the second pitch.

2. The method of claim 1, wherein the circuit board comprises a plurality of interconnect layers, each interconnect layer including a layer of dielectric material, a plurality of interconnects at a first surface of the layer of dielectric material and a plurality of contacts at a second surface of the layer of dielectric material, wherein the interconnects are attached to the contacts.

3. The method of claim 1, wherein forming the first plurality of contacts comprises:
    transferring a transfer substrate having the first contacts onto the surface of the circuit board, wherein transferring includes transferring the first contacts: (1) into a dielectric material of the circuit board below the surface of the circuit board prior to curing the dielectric material of the circuit board, and (2) within the first interconnect zone.

4. The method of claim 3, wherein transferring includes, after transferring and curing, removing the transfer substrate from the surface of the circuit board and leaving the first contacts below the surface of the circuit board.

5. The method of claim 3, wherein the transfer substrate is formed by:
    lithographically patterning a surface of a dielectric layer with the breakout pattern; then
    plating the breakout pattern with conductor; then
    DFR stripping the conductor; and then singulating the dielectric to produce a number of transfer substrates.

6. The method of claim 1, wherein forming the first plurality of contacts comprises:
laser scribing a pattern of trenches, at locations for the first contacts, into a surface of the circuit board and within the first interconnect zone; and then
forming conductive material in the patterned trenches to form the first contacts.

7. The method of claim 6, wherein laser scribing comprises laser projection and patterning (LPP) ablated traces of a pattern of trenches of the first contacts into a surface of the first interconnect zone; and wherein forming conductive material comprises filling the trenches with copper using electro-less or electrolytic plating of copper.

8. The method of claim 1, wherein the second area completely surrounds the first area on the surface of the circuit board.

9. The method of claim 1, wherein forming the first plurality of contacts comprises forming the first contacts using electronic device fabrication processing according to a design rule appropriate for direct chip attachment (DCA) of integrated circuit chip contacts to contacts of a substrate package to be mounted onto a circuit board; and wherein forming the second plurality of contacts or traces comprises forming traces to the first contacts using electronic device fabrication processing according to a design rule appropriate for direct attachment of substrate package contacts to contacts of a motherboard.

10. The method of claim 1, wherein the first pitch comprises a first pitch distance between midpoints of the first plurality of contacts of between 120 microns and 160 microns; and wherein the second pitch comprises a second pitch distance between midpoints of the second plurality of contacts or traces of between 390 microns and 410 microns.

11. The method of claim 1, wherein the first zone comprises a first square outer perimeter having first side lengths of between 9 mm and 11 mm; and wherein the second zone comprises a second square outer perimeter having second side lengths of between 14 mm and 18 mm.

12. The method of claim 1, further comprising:
direct chip attaching contacts of the integrated circuit chip to the first plurality of contacts; and
mounting the circuit board in one of a tablet computer, a smartphone, and a value phone.

* * * * *